United States Patent [19]

Schloemann et al.

[11] 4,060,798
[45] Nov. 29, 1977

[54] METHOD FOR INCREASING THE CRITICAL VELOCITY OF MAGNETIC BUBBLE PROPAGATION IN MAGNETIC MATERIALS

[75] Inventors: Ernst Fritz Rudolf August Schloemann, Weston; Harry Jerrold Van Hook, Lexington, both of Mass.

[73] Assignee: The United States of America as represented by the Secretary of the Navy, Washington, D.C.

[21] Appl. No.: 685,877

[22] Filed: May 12, 1976

[51] Int. Cl.² ............................................. G11C 19/08
[52] U.S. Cl. ..................................... 365/25; 365/37; 365/33
[58] Field of Search .................................. 340/174 TF

[56] References Cited

U.S. PATENT DOCUMENTS

| | | | |
|---|---|---|---|
| 3,876,994 | 4/1975 | Calhoun et al. | 340/174 TF |
| 3,964,035 | 6/1976 | Blank et al. | 340/174 TF |
| 3,979,736 | 9/1976 | Marsh | 340/174 TF |

*Primary Examiner*—James W. Moffitt
*Attorney, Agent, or Firm*—R. S. Sciascia; L. I. Shrago

[57] ABSTRACT

The critical velocity at which magnetic bubbles can propagate within a magnetic material is increased by establishing an easy axis of magnetization within the material. This axis is either growth-induced or strain-induced. In one embodiment, the material has a curvature imparted to it which places it under a uniaxial strain and this induces the magnetic easy axis.

2 Claims, 4 Drawing Figures

METHOD FOR INCREASING THE CRITICAL VELOCITY OF MAGNETIC BUBBLE PROPAGATION IN MAGNETIC MATERIALS

The present invention relates generally to magnetic bubble domain devices and, more particularly, to apparatus for and methods of increasing the velocity at which bubble domains can be propagated so as to permit these devices to operate at higher frequencies.

The materials currently used in such magnetic bubble devices as memory or storage registers are either magnetic garnet films that are deposited on substrates of a non-magnetic garnet or amorphous films of a gadolinium-colbalt alloy that are deposited on a variety of different substrates. It has recently been demonstrated that for both of these classes of materials, the velocity of bubble propagation is subject to certain limitations. This phenomenon is, thus, a potential obstacle to high-speed operation of bubble devices.

Plane domain walls cannot be propagated at velocities that exceed a certain critical velocity, and while this parameter varies from material to material, it is typically of the order of 10 m/sec. This same upper speed limit has been observed for the radial motion of the domain walls associated with bubble domains. Although translational motion of bubbles has been observed at higher velocities under the application of a controlled magnetic field gradient, their behavior becomes erratic at a velocity of the order of the critical velocity for plane or radial motion. This, according to one theory, is caused by the dynamic conversion of the original bubble to a hard bubble, the latter being a bubble in which the domain wall contains lines of singularity that extend from one side of the film to the other, so-called Bloch-lines.

The physical basis for the velocity saturation in plane-wall and radial-wall motion and of dynamic conversion effects observed in translational motion is only imperfectly understood at the present time. A substantially rigorous theory has been developed for the case of a plane wall in an infinite medium. For uniaxial anisotropy, the critical velocity is under those conditions give by $$v_{crit} = \gamma (H_a D)^{1/2}[(1 + \sigma)^{1/2} - 1] \quad (1)$$

where
$$\sigma = 4\pi M_o/H_a H_a = 2K_u/M_o D = 2A/M_o \quad (2)$$

and $\gamma$ is the gyromagnetic ratio, $M_o$ the saturation magnetization, $K_u$ the uniaxial anisotropy constant, $H_a$ the anisotropy field, A the exchange stiffness constant and D another material parameter that characterizes the strength of the exchange interaction. Under typical conditions $\gamma \simeq 17.6 \times 10^6$ sec$^{-1}$ Oe$^{-1}$, $H_a = 3600$e, $4\pi M_o = 40$ Oe, $A = 10^{-7}$ erg cm$^{-1}$. For this example $v_{crit} \simeq 50$ m/sec according to equation (1), i.e., considerably higher than the observed saturation velocity of $\simeq$ 10 m/sec. This lack of agreement is attributed to the fact that the internal structure of domain walls in films differs considerably from that in an infinite medium.

The internal wall structure becomes twisted due to the influence of the magnetic field arising from the effective magnetic charge at the film surfaces. This twisting lowers the critical velocity below the value given by equation (1). Theoretical models based on the twisted wall structure can account at least qualitatively for the observed saturation velocities and for the dynamic conversion effects.

In another class of magnetic materials, the orthoferrites, no saturation of the wall velocity has been observed at velocities up to 9000 m/sec. This difference between the garnets and the orthoferrites can be attributed to the fact that the latter have ortho-rhombic symmetry, whereas the former have cubic symmetry. In both cases, the dominant magnetic anisotropy is uniaxial with the easy axis perpendicular to the plane of the film. For the orthoferrites, a secondary easy axis exists in the plane of the film. This in-plane anisotropy substantially reduces the twisting of the wall structure so that the infinite-medium theory becomes more nearly applicable to the case of these films. Furthermore, the in-plane anisotropy raises the critical velocity for the plane wall in an infinite medium to a value much higher than that given in equation (1). It can be shown that $$v_{crit} = \gamma (H_a D)^{\frac{1}{2}} [(1 + \sigma + \frac{\Delta}{K_u})^{\frac{1}{2}} - 1] \quad (3)$$

for propagation perpendicular to the secondary easy axis and $$v_{crit} = \gamma (H_a D)^{\frac{1}{2}} |(1 + \sigma)^{\frac{1}{2}} - (1 + \frac{\Delta}{K_u})^{\frac{1}{2}}| \quad (4)$$

for propagation parallel to the secondary easy axis. Here $\Delta/K_u$ is the ratio of the second order anisotropy constant to the first order anisotropy constant of the ortho-rhombic material. It has been assumed that the total magnetic anisotropy energy is described by $$\epsilon_{anis} = K_u \sin^2 \theta + \Delta \sin^2 \theta \sin^2 \phi \quad (5)$$

where $\theta$ is the polar angle of the magnetization direction with respect to the primary easy axis and $\phi$ the azimuthal angle relative to a secondary easy axis which is perpendicular to the primary easy axis.

Another indication of the effectiveness of in-plane anisotropy in raising the critical velocity is the observation that the saturation velocity can be raised substantially by the application of a strong magnetic field in the plane of the film. It has been found that the saturation velocity goes from 7 m/sec at zero in-plane field to 150 m/sec at 500 Oe. Unfortunately, this method of raising the critical velocity cannot be regarded to be a practical solution to the problem. A rotating in-plane field of smaller magnitude ($\simeq$ 50 Oe) is needed for bubble propagation and the application of an additional static field would interfere with this function.

It is, accordingly, an object of the present invention to provide a method for increasing the critical translational velocity of magnetic bubbles in films of garnets and amorphous alloys.

Another object of the present invention is to suppress the immobilizing effects of the dynamic conversion of magnetic bubbles so as to raise their critical translational velocity.

Another object of the present invention is to increase the velocity of magnetic bubble propagation by intrinsic and induced anisotropy effects that establish a secondary easy magnetic axis in the propagating material.

Another object of the present invention is to provide a method for increasing the critical velocity of magnetic bubble domain propagation by establishing a secondary easy magnetic axis in the propagating medium by either crystalline anisotropy or strain-induced anisotropy.

Another object of the present invention is to provide a film for magnetic bubble devices wherein a uniaxial planar stress is established therein so as to counteract the twisted wall effect which lowers the operating frequency of the device.

Other objects, advantages and novel features of the invention will become apparent from the following detailed description of the invention when considered in conjunction with the accompanying drawings wherein.

In order to increase the critical velocity of magnetic bubble propagation and counteract the immobility of hard bubbles, a secondary easy magnetic axis is located within the propagating medium. In one case, this axis, which is in the plane of a magnetic garnet film, is due to crystalline anisotropy, an intrinsic effect. In another case, it is the result of strain-induced anisotropy, an induced effect.

As an example of the utilization of crystalline anisotropy for achieving high critical bubble velocity, consider a garnet material with a positive first order cubic anisotropy constant, $K_1$. $K_0$, $K_1$ and $K_2$ found in the crystal anisotropy energy equation are constants for a particular material and are expressed in ergs/cm$^3$, see for instance B. D. Cullity "Introduction to Magnetic Materials," Addison-Wesley, Reading, Mass., 1972, page 211. These constants in effect determine the direction of easy, medium and hard magnetization.

In the case of garnet material with $K_1 > 0$, the [100] directions are the easy directions. Therefore, it is advantageous to use substrates that are cut along a (110) plane in the crystal. In this way, the film plane contains two easy directions or one easy axis.

If the first order anisotropy constant $K_1$ is negative, the [111] directions are the easy directions. In this case, the film plane contains two easy axes. Some increase of the critical velocity occurs also under these conditions but for a given magnitude of $K_1$, the beneficial effect is smaller for negative values of this constant.

Figure 1:
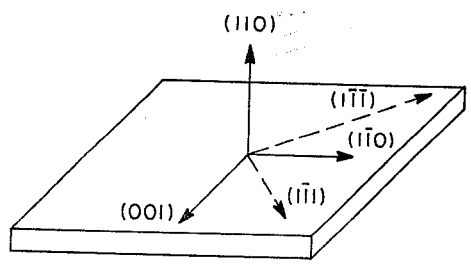
FIG. 1 illustrates the easy axis locations in the film due to magneto-crystalline anisotropy.

FIG. 1 illustrates a substrate where the dominant anisotropy is the growth-induced uniaxial anisotropy which establishes the primary easy axis perpendicular to the film plane. As shown in this Fig., the film plane contains one axis which is parallel to a cube edge of the crystal lattice and denoted as [001] and two non-equivalent axes which are parallel to body diagonals and denoted as [1$\bar{1}$1] and [1$\bar{1}\bar{1}$]. If the first order cubic anisotropy constant $K_1$ is greater than 0, then the [001] axis will be an in-plane easy axis of magnetization. If, on the other hand, $K_1$ is less than 0, the [1$\bar{1}$1] and [1$\bar{1}\bar{1}$] axes will be the in-plane easy axes.

An alternative method of establishing a secondary easy magnetic axis within the propagating medium, and one which involves resorting to strain-induced anisotropy, can be carried out in a variety of ways. This method does not depend upon either the structure or composition of the film or its substrate.

Figure 2:
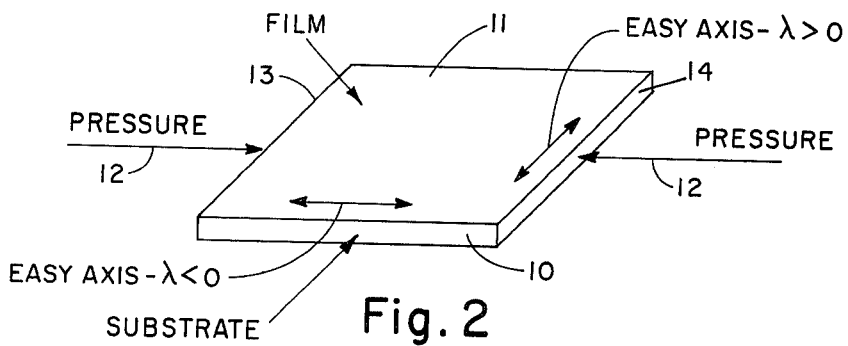
FIG. 2 illustrates one simple method for establishing a secondary easy magnetic axis within the magnetic bubble propagating medium by strain-induced anisotropy.

Referring now to FIG. 2, which shows one such arrangement, a substrate 10 having a suitable garnet or alloy film 11 deposited or formed thereon so as to be capable of propagating magnetic bubbles in response to an interacting magnetic field gradient, is subjected to a uniaxial stress as a consequence of the application of opposing forces 12 to opposite side faces 13 and 14 thereof. These forces place the film under compression.

Figure 3:
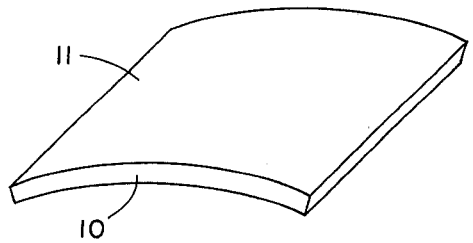
FIG. 3 shows a structural arrangement for creating a similar condition.

A similar effect can be achieved by bending or otherwise deforming the substrate after the film has been placed thereon so that it has, for example, the arcuated shape shown in FIG. 3 which in this illustrative example corresponds to a segment of a cylindrical surface. In this case, the magnetic propagating medium is under tension. By the same token, the substrate may be curved in an opposite manner so that its boundary surface, which is in contact with the film, is concave. With such a shape, the film again will be under compression. It will be appreciated that the curvature shown in FIG. 3 is extremely exaggerated for the sake of clarity.

The direction of the strain-induced in-plane easy axis depends upon the sign of the magnetostrictive constants. If the magnetostriction is isotropic, that is, if $\lambda_{100} = \lambda_{111}$, the in-plane easy axis will be perpendicular to the axis of compressive strain if $\lambda > 0$ and parallel to this axis, if $\lambda < 0$. The easy axis for these two cases is indicated by the doubled sided arrows in FIG. 2. If the magnetic film is under tension, the in-plane easy axis will be parallel to the strain axis if $\lambda > 0$ and perpendicular to this axis if $\lambda < 0$.

The location of the secondary easy axis depends upon the composition of the film for both compressive and tensile strain. The magnetostriction observed in garnet films is in general not isotropic, that is $\lambda_{100} \neq \lambda_{111}$, and it varies considerably with the chemical composition. Experimental data on this subject for garnet films may be found in a paper by E. A. Giess, B. A. Calhoun, E. Klokholm, T. R. McGuire and L. L. Rosier, "Garnet Compositions for Bubble Domain Systems Utilizing Stress-Induced Uniaxial Anisotropy" which appeared in the Mat. Res. Bull., Vol. 6, pp, 317-328, 1971.

A numerical estimate of the effectivenss of the strain-induced anisotropy in raising the critical velocity can be obtained by noting that the effective anisotropy field is approximately given by $$H_k \simeq Y\lambda \epsilon/M_o \qquad (6)$$

where $Y$ is Young's modulus, $\lambda$ the magnetostrictive constant, $\epsilon$ the strain to which the film is exposed and $M_o$ the saturation magnetization. Previous experience has shown that the strain can be approximately $10^{-3}$ for tension and approximately $2 \times 10^{-3}$ for compression before the films begin to crack. Typical material parameters are $Y = 2 \times 10^{12}$ erg/cm$^3$, $\lambda = 3 \times 10^{-6}$, $M_o = 10$ Oe. Thus for $\epsilon = 10^{-3}$, $H_k \simeq 600$ Oe.

This implies that the strength of the in-plane anisotropy field can be made much larger than $4\pi M_o$. Under those conditions the twisting of the wall structure is substantially completely eliminated. Theoretical calculations have shown that for the numerical example given above the critical velocity will be raised by a factor of approximately 15.

Figure 4:
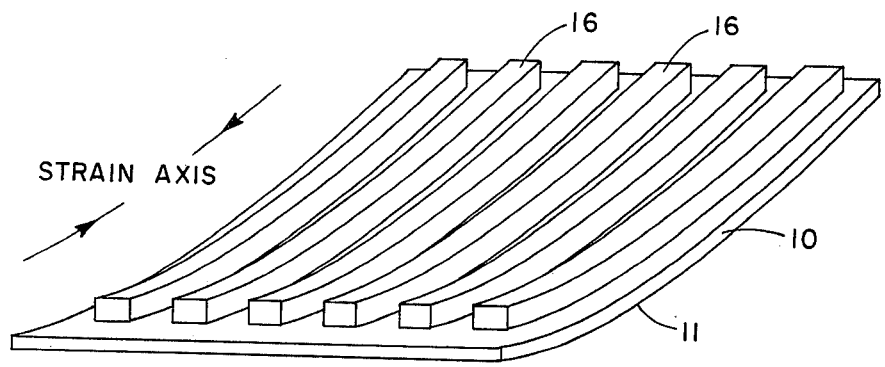
FIG. 4 depicts one method for producing the substrate and film curvature shown in FIG. 3.

An alternative arrangement for bending the substrate in order to establish the desired strain-induced anisotropy is shown in FIG. 4. In this particular case, the cylindrical bending is achieved by utilizing the difference in the coefficient of thermal expansion between the substrate material and a backing 16 of a different material bonded to it. This backing may be a thermal setting polymeric material contacting either the film side or the back side of the substrate. To produce the uniaxial planar stress, the resin may be applied in the shape of ribs. A multiplicity of such ribs are horizontally disposed on the back side of the substrate and are dimensioned such that they extend over substantially the complete length of the substrate. An appropriate mold may be used for forming these ribs and producing the geometric pattern shown. The mold can conveniently be made out of an alloy with a melting point slightly higher than the desired curing temperature of the polymeric material. Alloys that are commonly used as solder (for instance, 60 percent Pb, 40 percent Sn) may be used for this purpose. The polymeric material is poured into the mold, the substrate (with the film deposited on it) is placed on top of the polymeric material and the whole assembly is placed into an oven for curing. After the curing is completed, the temperature is briefly raised to melt away to mold. The assembly is then allowed to cool down to room temperature. Alternatively, the rib configuration can be produced by individual separating strips of a low strength material which may be left in place on the back side of the substrate.

After the ribs of polymeric material are cured at some elevated temperature, they contract differentially on cooling, and the accompanying stresses cause the substrate to bend cylindrically as shown in FIG. 3. The thermal expansion coefficient of most thermoplastic materials is much larger than that of the garnet film and substrate, viz. ~ 50–150 ppm $°C^{-1}$ vs ~ 10 ppm $°C^{-1}$ for the garnet materials. Therefore, the garnet film is usually placed in tension by resin on the back side and in compression for resin placed on the film side. An exception to this rule occurs when the substrate is very thin compared to the resin backing. When the substrate thickness is less than approximately 1/50 of the backing thickness, the film can be put into compression by resin on the back side of the substrate. In general, the magnitude of the planar stresses developed in the film depend on the thickness of the polymeric material as well as the curing temperature and expansion coefficient differences between materials. Thickness can be used to control magnitude of the planar stress up to the range where cracking might occur.

The polymeric material employed in fabricating one embodiment of the invention was a commercial epoxy resin which could be cured at elevated temperatures of 100° – 300° C. The specific materials were Emerson and Cumming Inc., Canton, Mass., Stycast 1269A and 1263 resins. These resins are dyglycidyl derivatives of bisphenol A. Other epoxy types such as epoxy Novalacs, cycloaliphatic depoxides may be used, as well as the thermosetting polycarbonate or polyester-type plastics.

There are other methods available to induce a suitable in-plane anisotropy in the film material. Deposition of the film in the presence of an interacting magnetic field produces such an effect. However, this technique can only be used with amorphous films since their deposition is usually carried out near room temperature. Conventional methods of growing epitaxial garnet films require temperatures much higher than the Curie temperature, and, consequently, the deposition process with a magnetic field is inappropriate since the film is not magnetic at these temperatures.

It has also been determined that the direction of an electric field applied during bias sputter deposition of amorphous films influences the direction of the easy axis.

Another method of inducing a suitable in-plane anisotropy in amorphous films is to utilize crystalline substrates wherein the thermal expansion coefficients in two mutually perpendicular directions of the substrate plane are different. The film deposition can be carried out at a temperature either higher or lower than the intended operating temperature of the bubble device. In this way, an axial stress is produced in the film which induces an in-plane anisotropy in an analogous manner to that established by the arrangements shown in FIGS. 2 and 3. Suitable substrate materials for this purpose are, for instance, quartz ($SiO_2$) or rutile ($TiO_2$). For quartz, the substrate should be cut in such a way that the hexagonal axis is in the substrate plane. The thermal expansion coefficient of quartz between 0° and 300° C is $9.6 \times 10^{-6}$ per ° C parallel to the hexagonal axis and $16.9 \times 10^{-6}$ per ° C perpendicular to this axis. For rutile, the substrate should be cut such that it contains the tetragonal a- and c- axes. The thermal expansion coefficient of rutile is $7.0 \times 10^{-6}$ per ° C parallel to the a- axis and $8.0 \times 10^{-6}$ per ° C parallel to the c- axis.

What is claimed is:

1. Apparatus for use in magnetic bubble devices so as to increase the frequency at which said bubble devices can operate, comprising in combination
    a substrate;
    a magnetic film formed on one surface of said substrate, the composition of said magnetic film being such that magnetic bubbles may be created and propagated therein; and
    means for maintaining within said magnetic film a uniaxial strain-induced, in-plane, easy axis of magnetization.

2. An arrangement as defined in claim 1 wherein said means for producing said strain-induced, in-plane, easy axis includes a plurality of ribs formed on a surface of said substrate so as to impart to said substrate and said magnetic film a curvature which causes said magnetic film to be placed under tension.

* * * * *